(12) United States Patent
Liu et al.

(10) Patent No.: US 11,114,424 B2
(45) Date of Patent: Sep. 7, 2021

(54) DISPLAY SUBSTRATE AND METHOD FOR PREPARING THE SAME, AND DISPLAY DEVICE

(71) Applicant: BOE TECHNOLOGY GROUP CO., LTD., Beijing (CN)

(72) Inventors: Dongni Liu, Beijing (CN); Minghua Xuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/766,603

(22) PCT Filed: Dec. 16, 2019

(86) PCT No.: PCT/CN2019/125626
§ 371 (c)(1),
(2) Date: May 22, 2020

(87) PCT Pub. No.: WO2020/164303
PCT Pub. Date: Aug. 20, 2020

(65) Prior Publication Data
US 2021/0134775 A1    May 6, 2021

(30) Foreign Application Priority Data
Feb. 15, 2019    (CN) .......................... 201910116828.6

(51) Int. Cl.
*H01L 25/16*    (2006.01)
*H01L 33/62*    (2010.01)
(Continued)

(52) U.S. Cl.
CPC ............ *H01L 25/167* (2013.01); *H01L 25/18* (2013.01); *H01L 27/1259* (2013.01); *H01L 33/62* (2013.01); *H01L 2933/0066* (2013.01)

(58) Field of Classification Search
CPC ... H01L 25/167; H01L 27/1259; H01L 33/62; H01L 25/18; H01L 2933/0066
See application file for complete search history.

(56) References Cited

U.S. PATENT DOCUMENTS

2014/0319496 A1    10/2014  Kim et al.
2015/0084019 A1    3/2015   Ren
(Continued)

FOREIGN PATENT DOCUMENTS

CN    103151368 A    6/2013
CN    104134679 A    11/2014
(Continued)

OTHER PUBLICATIONS

Office Action dated Jul. 1, 2020 in Chinese Application No. 201910116828.6 (16 pages).
(Continued)

*Primary Examiner* — Victor A Mandala
(74) *Attorney, Agent, or Firm* — Muncy, Geissler, Olds & Lowe, P.C.

(57) ABSTRACT

The present disclosure provides a display substrate, a method for preparing the same, and a display device. The display substrate includes: a base substrate; a display function layer located on the base substrate, a first groove arranged in the first surface, and a first connection sub-line located in the first groove and covering a bottom and each side wall of the first groove, the first connection sub-line being connected to a signal input terminal; an integrated circuit located on a second surface, a second groove arranged in the second surface, and a second connection sub-line located in the second groove, the second connection sub-line being connected to the first connection sub-line and a signal output terminal of the integrated circuit.

20 Claims, 5 Drawing Sheets

(51) Int. Cl.
*H01L 27/12* (2006.01)
*H01L 25/18* (2006.01)

(56) References Cited

U.S. PATENT DOCUMENTS

| | | | |
|---|---|---|---|
| 2015/0221694 A1* | 8/2015 | Baba | H01L 27/1464 |
| | | | 257/443 |
| 2016/0336532 A1 | 11/2016 | Li | |
| 2016/0336540 A1 | 11/2016 | Li | |
| 2017/0148826 A1 | 5/2017 | Choi | |
| 2018/0114820 A1 | 4/2018 | Shim et al. | |
| 2018/0152657 A1* | 5/2018 | Miyazawa | H04N 5/341 |
| 2018/0182689 A1 | 6/2018 | Okuno | |
| 2019/0004359 A1 | 1/2019 | Yueh et al. | |
| 2019/0043910 A1* | 2/2019 | Miyazawa | H01L 27/14634 |
| 2019/0109180 A1 | 4/2019 | Liang et al. | |
| 2019/0206927 A1* | 7/2019 | Lee | H01L 33/30 |
| 2020/0105790 A1 | 4/2020 | Gu et al. | |
| 2020/0105813 A1* | 4/2020 | Hashiguchi | H01L 25/065 |
| 2020/0243591 A1* | 7/2020 | Iijima | H01L 25/07 |

FOREIGN PATENT DOCUMENTS

| | | |
|---|---|---|
| CN | 104851892 A | 8/2015 |
| CN | 104992956 A | 10/2015 |
| CN | 107039377 A | 8/2017 |
| CN | 107680992 A | 2/2018 |
| CN | 107978619 A | 5/2018 |
| CN | 109216305 A | 1/2019 |
| CN | 109244086 A | 1/2019 |
| CN | 109314061 A | 2/2019 |
| CN | 109817659 A | 5/2019 |
| JP | 2006012889 A | 1/2006 |

OTHER PUBLICATIONS

International Search Report dated Mar. 23, 2020 in Application No. PCT/CN2019/125626 (14 pages).

* cited by examiner

DISPLAY SUBSTRATE AND METHOD FOR PREPARING THE SAME, AND DISPLAY DEVICE

CROSS-REFERENCE TO RELATED APPLICATIONS

This application is the U.S. national phase of PCT Application No. PCT/CN2019/125626 filed on Dec. 16, 2019, which claims a priority to Chinese Patent Application No. 201910116828.6 filed on Feb. 15, 2019, the disclosures of which are incorporated in their entirety by reference herein.

TECHNICAL FIELD

The present disclosure relates to the field of display technology, in particular to a display substrate, a method for preparing the same, and a display device.

BACKGROUND

The display market is currently booming, and more and more new display products will emerge in the future as consumer demand for various display products such as laptops, smartphones, TVs, tablets, smart watches and fitness wristbands continues to increase.

SUMMARY

In an aspect, a display substrate is provided, including: a base substrate; a display function layer located on a first surface of the base substrate, a first groove arranged in the first surface and recessed from the first surface toward the base substrate, and a first connection sub-line located in the first groove and covering a bottom and each side wall of the first groove, in which the first connection sub-line is connected to a signal input terminal of the display function layer; an integrated circuit located on a second surface of the base substrate opposite to the first surface, a second groove arranged in the second surface and recessed from the second surface toward the base substrate to the first connection sub-line, and a second connection sub-line located in the second groove, in which the second connection sub-line is connected to the first connection sub-line and a signal output terminal of the integrated circuit, in which an orthogonal projection of the first groove on the base substrate at least partially overlaps an orthogonal projection of the second groove on the base substrate, and the first groove and the second groove communicate with each other and together penetrate the base substrate.

In some embodiments, a cross-sectional area of the first groove parallel to the base substrate gradually decreases in a direction from the first surface to the second surface.

In some embodiments, a cross-sectional area of the second groove parallel to the base substrate gradually decreases in a direction from the second surface to the first surface.

In some embodiments, a depth of the first groove in a direction from the first surface to the second surface is from one third to two thirds of a thickness of the base substrate in a direction from the first surface to the second surface.

In some embodiments, a depth of the first groove in a direction from the first surface to the second surface is half of a thickness of the base substrate in a direction from the first surface to the second surface.

In some embodiments, the display function layer has a protrusion part protruding outward from the first surface to the base substrate, and the first connection sub-line covers the protrusion part.

In some embodiments, the first connection sub-line and the second connection sub-line are sequentially stacked on the protrusion part in a direction from the first surface to the second surface.

An embodiment of the present disclosure further provides a display device including the display substrate as described above.

An embodiment of the present disclosure further provides a method for preparing a display substrate, including: providing a base substrate; etching the base substrate to form a first groove in the first surface of the base substrate which recesses from a first surface to the base substrate; forming a first connection sub-line in the first groove which covers a bottom and each side wall of the first groove; forming a display function layer on the first surface, a signal input terminal of which is connected to the first connection sub-line; etching the base substrate from a second surface of the base substrate opposite to the first surface to form a second groove for exposing the first connection sub-line; and forming a second connection sub-line connected to the first connection sub-line in the second groove, in which an orthogonal projection of the first groove on the base substrate at least partially overlaps an orthogonal projection of the second groove on the base substrate, and the first groove and the second groove communicate with each other and together penetrate the base substrate.

In some embodiments, a cross-sectional area of the first groove parallel to the base substrate gradually decreases in a direction from the first surface to the second surface.

In some embodiments, a cross-sectional area of the second groove parallel to the base substrate gradually decreases in a direction from the second surface to the first surface.

In some embodiments, an integrated circuit is bound on the second surface, and a signal output terminal of the integrated circuit being connected to the second connection sub-line.

In some embodiments, the method further includes: forming a protective layer covering the display function layer after the forming the display function layer on the first surface.

In some embodiments, the base substrate is a flexible substrate, and the providing the base substrate includes: forming the flexible substrate on a rigid carrier board, wherein the second surface of the flexible substrate is in contact with the rigid carrier board.

In some embodiments, the etching the base substrate to form the first groove in the first surface of the base substrate which recesses from the first surface to the base substrate includes: etching the flexible substrate to form a first groove in the first surface of the flexible substrate.

In some embodiments, the etching the base substrate from the second surface of the base substrate includes:
peeling off the flexible substrate on which the display function layer is formed from the rigid carrier board, and etching the flexible substrate from the second surface of the flexible substrate.

In some embodiments, the method further includes transferring a micro light-emitting diode on the first surface after the integrated circuit has been bound on the second surface.

In some embodiments, a depth of the first groove in a direction from the first surface to the second surface is from one third to two thirds of a thickness of the base substrate in a direction from the first surface to the second surface.

In some embodiments, a depth of the first groove in a direction from the first surface to the second surface is half of a thickness of the base substrate in a direction from the first surface to the second surface.

REFERENCE NUMBERS i. 1 flexible substrate; 2 display function layer; 3 protective film; 4 signal connection line; 41 first connection sub-line; 42 second connection sub-line; 5 rigid carrier board; 6 first groove; 7 second groove; 8 integrated circuit; 9 micro light-emitting diodes; 10 black matrix; 11 bonding contact layer; 12 protective insulating layer; 13 planarization layer; 14 connection electrode; 15 first interlayer insulating layer; 16, 17 source and drain; 19 gate insulating layer; 20 gate; 21 second interlayer insulating layer; 22 active layer; 23 barrier layer; 24 LED electrode.

DETAILED DESCRIPTION

In order to make the technical problems to be solved, the technical solutions, and the advantages of the examples of the present disclosure, the present disclosure will be described hereinafter in conjunction with the drawings and specific examples.

At present, most display products are provided with frames, which usually arranges the connection terminal (for example, the integrated circuit bonding region) on the periphery of the display region of the display panel. A full-screen display product without frames can enable users to get a better viewing experience, and will definitely explode the new consumer market. Based on this, how to realize a full-screen display product without frames is a technical problem to be urgently solved by those skilled in the art. Full-screen technology has gradually become the mainstream technology of mobile phones and other hand-held devices. In order to achieve true frameless display products, a technology that realizes frameless display through the combination of the front and back of the backplane and the transfer manner of micro light-emitting diode (micro LED) is proposed. A display film layer such as a thin film transistor is designed on front surface of the display substrate, an integrated circuit binding region is arranged on the back surface of the display substrate, the base substrate of the display substrate is punched, and then the metal is filled in the holes to realize the connection between the front and back signal lines.

Figure 1:
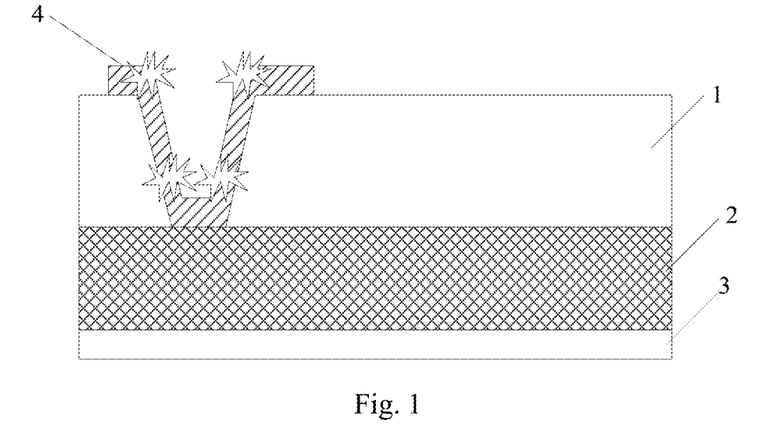
FIG. 1 is a schematic view showing that a signal connection line is broken.
Figure 2:
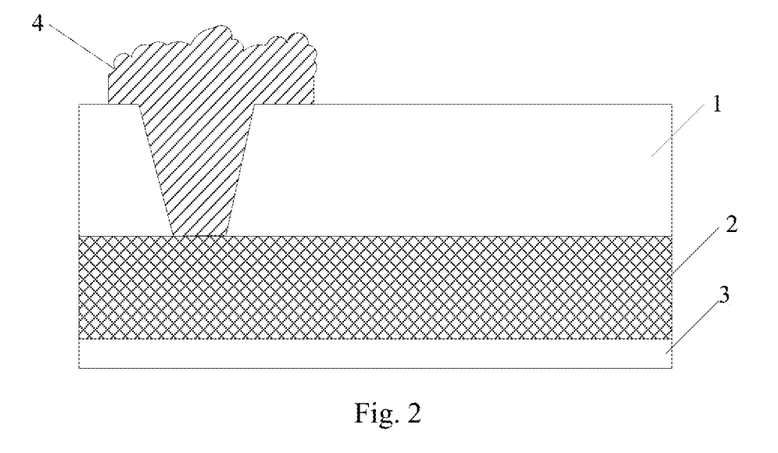
FIG. 2 is a schematic view showing that the surface of the signal connection line formed by electroplating is uneven.

At present, there are two ways to fill the hole with metal. One manner is a sputtering method, that is, after the via hole is made, the signal connection line connecting the front and back of the display substrate is formed in the via hole by sputtering. However, due to the base substrate is relatively thick, the slope angle of the via hole is small and the depth is large. As shown in FIG. 1, the signal connection line 4 is prone to open circuit, and then the connection is abnormal, thereby affecting the display effect of the display product. The other manner is an electroplating method, that is, after the via hole is formed, as shown in FIG. 2, the signal connection line 4 connecting the front and back of the display substrate is formed in the via hole by electroplating. However, after the signal connection line 4 is formed by electroplating, the surface of the signal connection line 4 is uneven. Thus in the subsequent IC bonding process, the surface of the signal connection line 4 needs to be planarized. That is, the chemical mechanical polishing (CMP) process is used to remove the thicker metal, however, since the adhesion of the metal to the base substrate is relatively poor, when the CMP process is performed, the metal is easy to fall off. This leads to the abnormal connection, which thereby affects the display effect of the display product.

In view of the above problems, the embodiments of the present disclosure provide a display substrate, a method for preparing the same, and a display device, which can ensure the display effect of the display device.

An embodiment of the present disclosure provides a display substrate, including: a base substrate; a display function layer located on a first surface of the base substrate, a first groove arranged in the first surface and recessed from the first surface toward the base substrate, and a first connection sub-line located in the first groove and covering a bottom and each side wall of the first groove, in which the first connection sub-line is connected to a signal input terminal of the display function layer; an integrated circuit located on a second surface of the base substrate opposite to the first surface, a second groove arranged in the second surface and recessed from the second surface toward the base substrate to the first connection sub-line, and a second connection sub-line located in the second groove, in which the second connection sub-line is connected to the first connection sub-line and a signal output terminal of the integrated circuit, in which an orthogonal projection of the first groove on the base substrate at least partially overlaps an orthogonal projection of the second groove on the base substrate, and the first groove and the second groove communicate with each other and together penetrate the base substrate.

Optionally, a cross-sectional area of the first groove parallel to the base substrate gradually decreases in a direction from the first surface to the second surface.

Optionally, a cross-sectional area of the second groove parallel to the base substrate gradually decreases in a direction from the second surface to the first surface.

In this embodiment, the signal connection line connecting the integrated circuit and the display function layer is composed of a first connection sub-line and a second connection sub-line. When the first connection sub-line is prepared, a first groove is formed to only partly penetrate the base substrate, and a first connection sub-line is formed in the first groove. Since a depth of the first groove in the direction from the first surface to the second surface is less than a thickness of the base substrate in the direction from the first surface to the second surface, the slope angle of the first groove is relatively large, which can ensure that the first connection sub-line is not prone to break. When the second connection sub-line is prepared, a second groove is formed to only partly penetrate the base substrate. Since a depth of the second groove is less than a thickness of the base substrate in the direction from the first surface to the second surface, the slope of the second groove is relatively large, which can ensure that the second connection sub-line is not prone to break. Thus it can ensure that the signal connection line is not prone to open circuit, optimize the connection between the integrated circuit and the display function layer, and further ensure the display effect of the display device.

Among them, the display function layer includes a thin film transistor, an insulating layer, a contact layer and other film layers, which can enable the micro light-emitting diode to realize display under the drive of an electric signal.

In order to make the slope angle of the first groove relatively larger, the depth of the first groove in the direction from the first surface to the second surface cannot be too large, thus a depth of the first groove in a direction from the first surface to the second surface can be from one third to two thirds of a thickness of the base substrate in a direction from the first surface to the second surface. If the depth of the first groove is greater than two thirds of the thickness of the base substrate, the slope angle of the first groove is too small, so that the first connection sub-line is prone to open circuit. If the depth of the first groove is less than one third of the thickness of the base substrate, the slope angle of the second groove directly opposite to the first groove is too small, so that the second connection sub-line is prone to open circuit.

The display function layer has a protrusion part protruding outward from the first surface to the base substrate, and the first connection sub-line covers the protrusion part.

The first connection sub-line and the second connection sub-line are sequentially stacked on the protrusion part in a direction from the first surface to the second surface.

Optionally, the depth of the first groove in a direction from the first surface to the second surface is half of the thickness of the base substrate in a direction from the first surface to the second surface. Thus the thickness of the first groove and the second groove both are half of the thickness of the base substrate. It can make the slope angle of the first groove relatively large, and thereby ensure that the first connection sub-line is not prone to open circuit. At the same time, it can also make the slope angle of the second groove relatively large, and thereby ensure that the second connection sub-line is not prone to open circuit. Furthermore, it can ensure that the whole signal connection line is not prone to open circuit, and thereby ensure the display effect of the display device.

An embodiment of the present disclosure further provides a display device including the display substrate as described above. The display device may be any product or component having a display function, such as a television, a display, a digital photo frame, a mobile phone, a tablet computer, etc., in which the display device further includes a flexible circuit board, a printed circuit board, and a backplane.

An embodiment of the present disclosure further provides a method for preparing a display substrate, including: providing a base substrate; etching the base substrate to form a first groove on the first surface of the base substrate which recesses from a first surface to the base substrate; forming a first connection sub-line in the first groove which covers a bottom and each side wall of the first groove; forming a display function layer on the first surface, a signal input terminal of which is connected to the first connection sub-line; etching the base substrate from a second surface of the base substrate opposite to the first surface to form a second groove for exposing the first connection sub-line; and forming a second connection sub-line connected to the first connection sub-line in the second groove, in which an orthogonal projection of the first groove on the base substrate at least partially overlaps an orthogonal projection of the second groove on the base substrate, and the first groove and the second groove communicate with each other and together penetrate the base substrate.

A cross-sectional area of the first groove parallel to the base substrate gradually decreases in a direction from the first surface to the second surface.

A cross-sectional area of the second groove parallel to the base substrate gradually decreases in a direction from the second surface to the first surface.

An integrated circuit is bound on the second surface, and a signal output terminal of the integrated circuit is connected to the second connection sub-line.

In this embodiment, the signal connection line connecting the integrated circuit and the display function layer is composed of a first connection sub-line and a second connection sub-line. When the first connection sub-line is prepared, a first groove is formed to only partly penetrate the base substrate, and a first connection sub-line is formed in the first groove. Since a depth of the first groove in the direction from the first surface to the second surface is less than a thickness of the base substrate in the direction from the first surface to the second surface, the slope angle of the first groove is relatively large. It can ensure that the first connection sub-line is not prone to break. When the second connection sub-line is prepared, a second groove is formed to only partly penetrate the base substrate. Since a depth of the second groove is less than a thickness of the base substrate, the slope of the second groove is relatively large. It can ensure that the second connection sub-line is not prone to break, and that the signal connection line is not prone to open circuit. Further the connection between the integrated circuit and the display function layer is optimized, thereby ensuring the display effect of the display device.

Among them, the display function layer includes a thin film transistor, an insulating layer, a contact layer and other film layers, which can enable the micro light-emitting diode to realize display under the drive of an electric signal.

After the forming the display function layer on the first surface, the method further includes forming a protective layer covering the display functional layer, and the protective layer can protect the display functional layer from being damaged in subsequent processes.

The base substrate is a flexible substrate, and the providing the base substrate includes forming the flexible substrate on a rigid carrier board, and a second surface of the flexible substrate is in contact with the rigid carrier board.

The etching the base substrate to form the first groove in the first surface of the base substrate which recesses from the first surface to the base substrate includes etching the flexible substrate to form a first groove in the first surface of the flexible substrate.

The etching the base substrate from the second surface of the base substrate includes: peeling off the flexible substrate on which the display function layer is formed from the rigid carrier board, and etching the flexible substrate from the second surface of the flexible substrate.

In the case that the display substrate is a micro light-emitting diode display substrate, after the integrated circuit has been bound on the second surface, the method further includes transferring a micro light-emitting diode on the first surface.

In order to make the slope angle of the first groove larger, since the depth of the first groove in the direction from the first surface to the second surface cannot be too large, a depth of the first groove in a direction from the first surface to the second surface can be from one third to two thirds of a thickness of the base substrate in a direction from the first surface to the second surface. If the depth of the first groove is greater than two thirds of the thickness of the base substrate, the slope angle of the first groove is too small, so that the first connection sub-line is prone to open circuit. If the depth of the first groove is less than one third of the thickness of the base substrate, the slope angle of the second groove directly opposite to the first groove is too small, so that the second connection sub-line is prone to be broken.

Preferably, the depth of the first groove in a direction from the first surface to the second surface is half of the thickness of the base substrate in a direction from the first surface to the second surface, so that the thicknesses of the first groove and the second groove both half of the base substrate. It can make the slope angle of the first groove relatively large, and thereby ensure that the first connection sub-line is not prone to open circuit. At the same time, it can also make the slope angle of the second groove relatively large, and thereby ensure that the second connection sub-line is not prone to open circuit, and that the signal connection line is not prone to open circuit. Thus the connection status between the integrated circuit and the display function layer is optimized, thereby ensuring the display effect of the display device.

Taking the display substrate as a flexible micro light-emitting diode display substrate as an example, the method for preparing the display substrate according to the present disclosure will be further described in conjunction with the drawings and specific embodiments, and the method for preparing the display substrate according to this embodiment includes the following steps.

Figure 3:
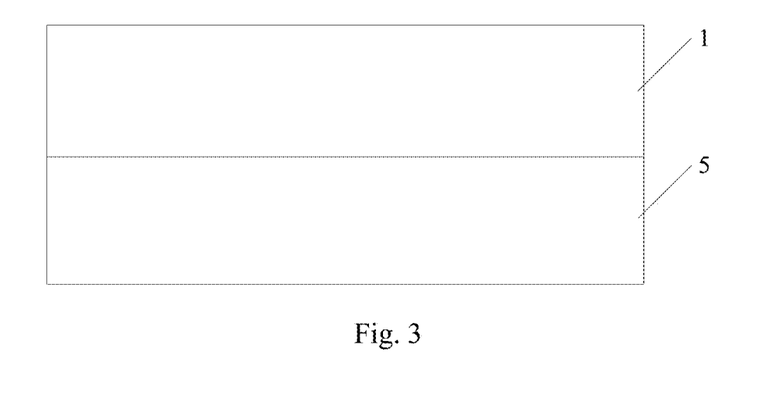
FIG. 3 is a schematic view showing the forming a flexible substrate on a rigid carrier board according to an embodiment of the present disclosure.

Step 1. As shown in FIG. 3, a rigid carrier board 5 is provided, and a flexible substrate 1 is formed on the rigid carrier board 5.

Specifically, the rigid carrier board 5 may be made of a glass substrate or a quartz substrate, and a polyimide layer may be coated on the rigid carrier board 5 as the flexible substrate 1.

Figure 4:
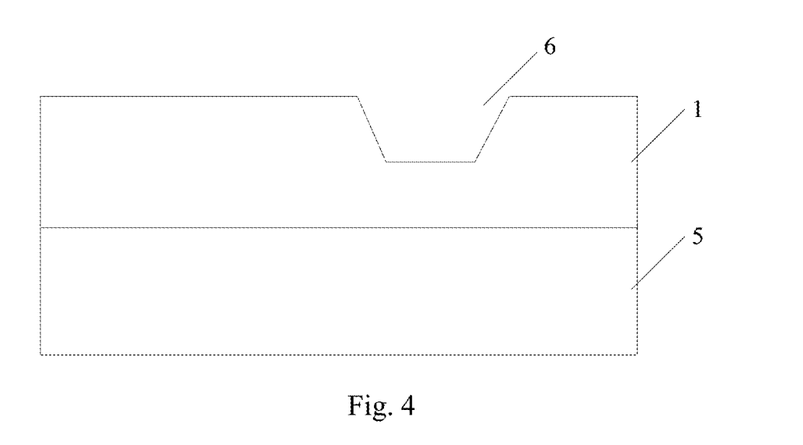
FIG. 4 is a schematic view showing the forming a first groove in a flexible substrate according to an embodiment of the present disclosure.

Step 2. As shown in FIG. 4, a first groove 6 is formed on the flexible substrate 1, and the depth of the first groove 6 is half of the thickness of the flexible substrate 1.

Figure 5:
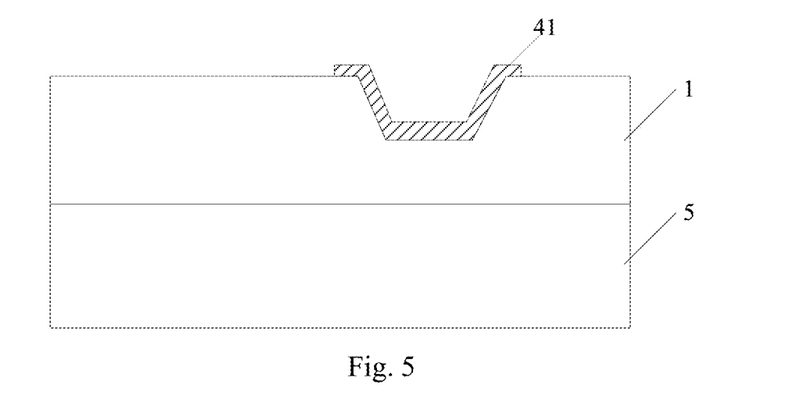
FIG. 5 is a schematic view showing the forming a first connection sub-line according to an embodiment of the present disclosure.

Step 3. As shown in FIG. 5, a first connection sub-line 41 is formed on the flexible substrate 1, and the first connection sub-line 41 covers the bottom and the side walls of the first groove 6.

Specifically, a conductive layer may be formed on the flexible substrate 1, and the conductive layer is patterned to form the first connection sub-line 41.

Figure 6:
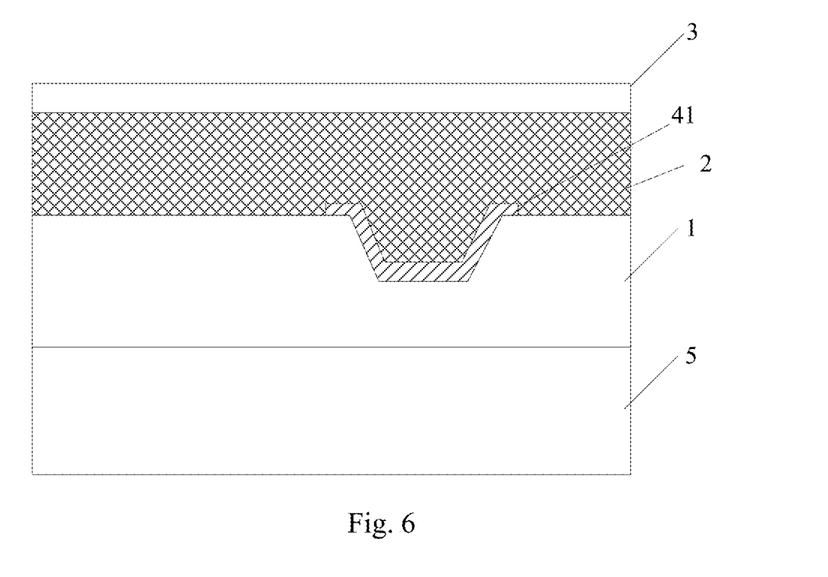
FIG. 6 is a schematic view showing the case after the forming a display function layer and a protective film according to an embodiment of the present disclosure.

Step 4. As shown in FIG. 6, a display function layer 2 is formed on the flexible substrate 1, and a protective layer 3 covering the display function layer 2 is formed.

Among them, the display function layer includes a thin film transistor, an insulating layer, a contact layer and other film layers, which can enable the micro light-emitting diode to realize display under the drive of an electric signal. The signal input terminal of the display function layer 2 is connected to the first connection sub-line 41, and the electrical signal input through the first connection sub-line 41 can drive the display function layer 2 to display.

The protective layer 3 is resistant to high temperature, and is capable of protecting the display function layer 2 in the subsequent preparing process.

Figure 7:
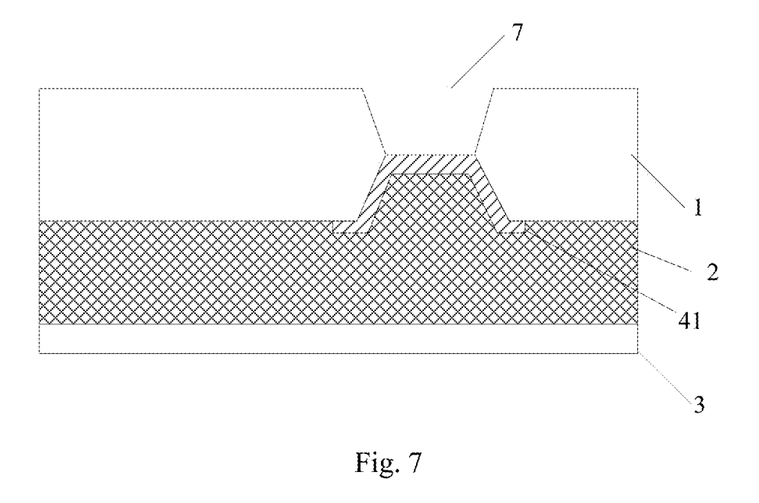
FIG. 7 is a schematic view showing the etching a flexible substrate to expose a first connection sub-line according to an embodiment of the present disclosure.

Step 5. As shown in FIG. 7, the protective film 3, the display function layer 2 and the flexible substrate 1 are peeled off from the rigid carrier board 5, the flexible substrate 1 from the surface of the flexible substrate 1 away from the display function layer 2 is punched, and the position of the second groove 7 is directly opposite to the position of the first groove 6, thereby exposing the first connection sub-line 41.

Figure 8:
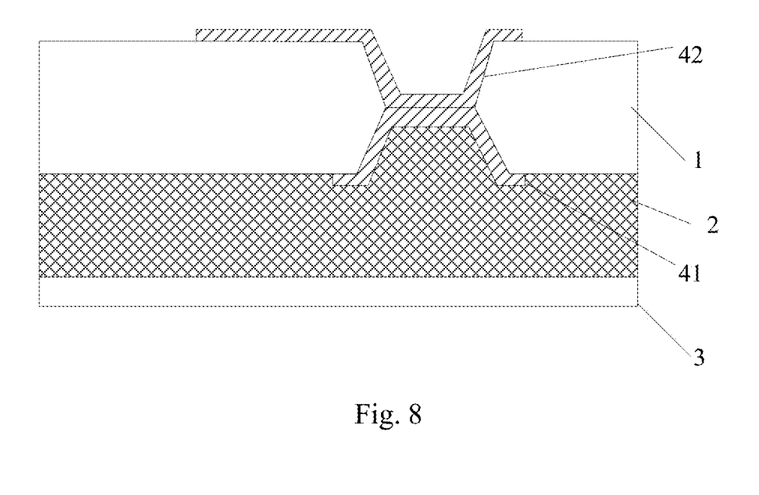
FIG. 8 is a schematic view showing the forming a second connection sub-line according to an embodiment of the present disclosure.

Step 6. As shown in FIG. 8, a second connection sub-line 42 is formed in the second groove 7.

Specifically, a conductive layer, such as a Cu layer, may be formed on the surface of the flexible substrate 1 away from the display function layer 2 by evaporation process, and the Cu layer is patterned to form a second connection sub-line 42 connected with an IC bonding pin and a first connection sub-line 41. Since the protective layer 3 is attached to the display function layer 2, it can be ensured that the display function layer 2 is not affected in the evaporation process.

Figure 9:
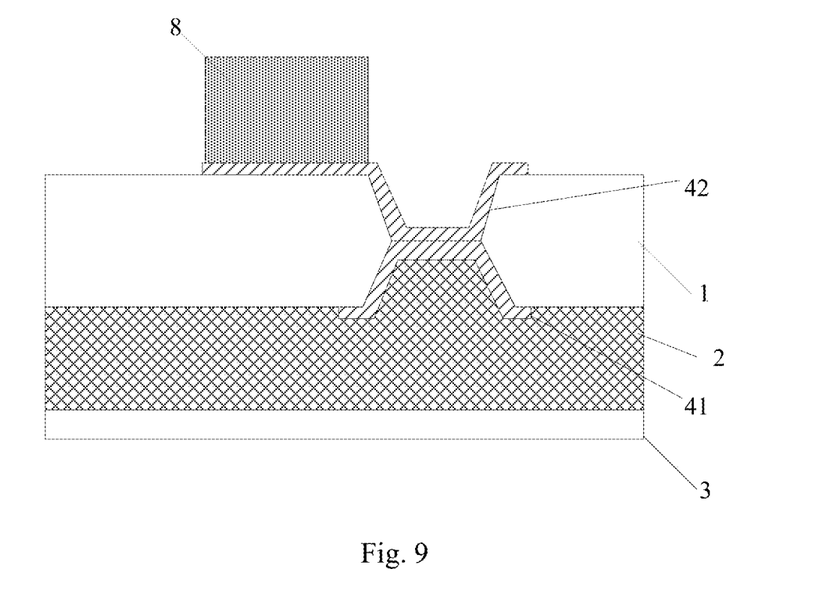
FIG. 9 is a schematic view showing that an integrated circuit is bound according to an embodiment of the present disclosure.

Step 7. As shown in FIG. 9, the binding of the integrated circuit 8 is completed on the surface of the flexible substrate 1 away from the display function layer 2.

Figure 10:
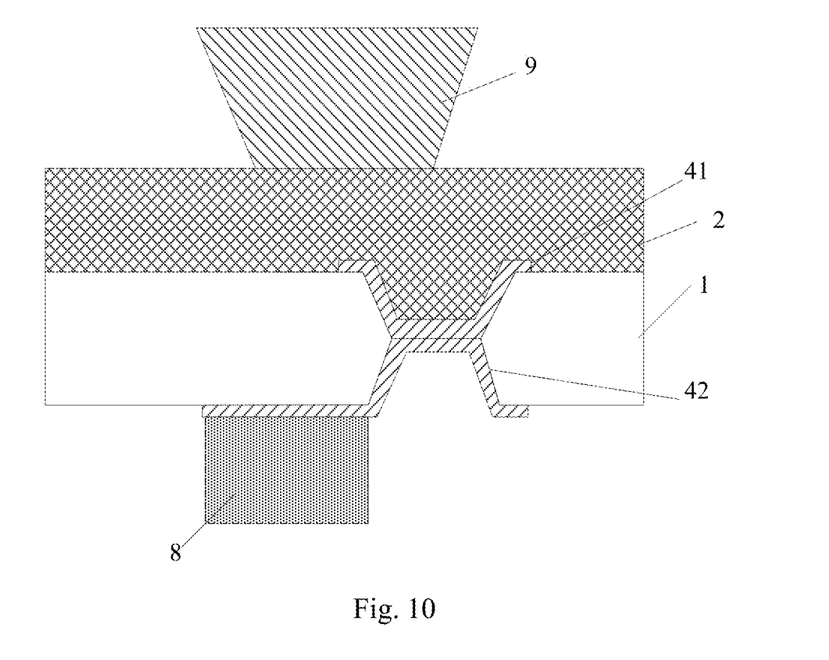
FIG. 10 is a schematic view showing the case after transferring micro-LED according to an embodiment of the present disclosure.

Step 8. As shown in FIG. 10, the protective layer 3 is removed, and the transferring of the micro light-emitting diode 9 is completed on the surface of the flexible substrate 1 facing the display function layer 2.

After the above steps, the display substrate of this embodiment can be obtained. As shown in FIG. 10, in this embodiment, the integrated circuit 8 is located on the surface of the flexible substrate 1 away from the display function layer 2, and the micro light-emitting diode 9 and the display function layer 2 are located on the other surface of the flexible substrate 1. The signal input terminal of the display function layer 2 is connected to the first connection sub-line 41, and the signal output terminal of the integrated circuit 8 is connected to the second connection sub-line 42. The first connection sub-line 41 is connected to the second connection sub-line 42, and the first connection sub-line 41 and the second connection sub-line 42 constitute a signal connection line connecting the integrated circuit and the display function layer. When the first connection sub-line is prepared, a first groove is formed to only partly penetrate the base substrate, and a first connection sub-line is formed in the first groove. Since a depth of the first groove is less than a thickness of the base substrate, the slope angle of the first groove is relatively large. It can ensure that the first connection sub-line is not prone to break. When the second connection sub-line is prepared, a second groove is formed to only partly penetrate the base substrate. Since a depth of the second groove is less than a thickness of the base substrate, the slope of the second groove is relatively large. It can ensure that the second connection sub-line is not prone to break, and that the signal connection line is not prone to open circuit. Thus it optimizes the connection between the integrated circuit and the display function layer, and ensures the display effect of the display device.

Figure 11:
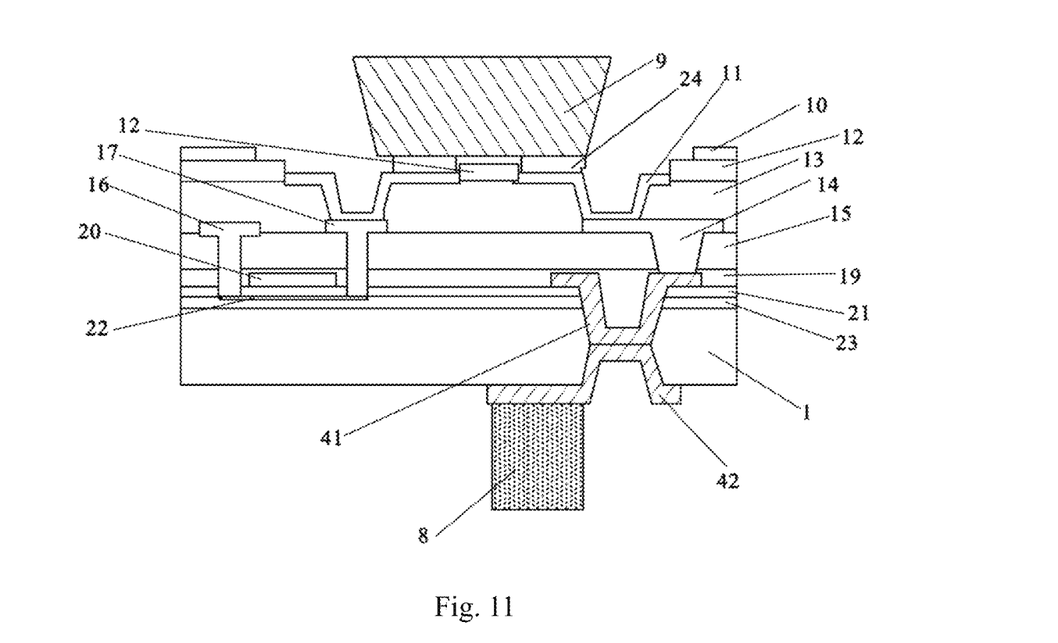
FIG. 11 is a schematic view showing a specific display substrate after transferring micro-LED according to an embodiment of the present disclosure.

In some embodiments, as shown in FIG. 11, in this embodiment, the display function layer 2 includes: a black matrix 10, a bonding contact layer 11, a protective insulating layer 12, a planarization layer 13, a connection electrode (a signal input terminal of the display function layer) 14, a first interlayer insulating layer 15, a source and a drain 16, 17, a gate insulating layer 19, a gate 20, a second interlayer insulating layer 21, an active layer 22, and a barrier layer 23. The barrier layer 23 is arranged on and in direct contact with the surface of the flexible substrate 1 away from the second connection sub-line 42. Among them, the barrier layer 23 is used to prevent the flexible substrate from affecting the active layer 22. The active layer 22 is arranged on the surface of the barrier layer 23 away from the flexible substrate 1 and covers only a part of the barrier layer 23. The second interlayer insulating layer 21 is arranged on and in direct contact with the active layer 22 and the barrier layer 23. The gate 20 is arranged on the surface of the second interlayer insulating layer 21 away from the flexible substrate 1 and covers only a part of the second interlayer insulating layer 21. Among them, a part of the first connection sub-line 41 passes through the second interlayer insulating layer 21, the barrier layer 23 and a part of the flexible substrate 1, to be in direct contact with the second connection sub-line 42. The gate insulating layer 19 is arranged on and in direct contact with the gate 20, the second interlayer insulating layer 21, and the first connection sub-line 41. The first interlayer insulating layer 15 is arranged on and in direct contact with the gate insulating layer 19. The source and drain 16, 17 are arranged on the surface of the first interlayer insulating layer 15 away from the flexible substrate 1, and a part thereof passes through the first interlayer insulating layer 15, the gate insulating layer 19, and the second interlayer insulating layer 21, to be in direct contact with the active layer 22. The connection electrode (signal input terminal of the display function layer) 14 is arranged on the surface of the first interlayer insulating layer 15 away from the flexible substrate 1, and a part thereof passes through the first interlayer insulating layer 15 and the gate insulating layer 19 to be in direct contact with the first connection sub-line 41. The planarization layer 13 is arranged on and in direct contact with the source and drain 16, 17, the connection electrode 14, and the first interlayer insulating layer 15. Two bonding contact layers 11 are arranged on the surface of the planarization layer 13 away from the flexible substrate 1, and a part thereof passes through the planarization layer 13 to be in direct contact with the source and drain 16, 17 and the connection electrode 14, respectively. Among them, the binding contact layer 11 is used to contact the LED electrode 24 of the micro light-emitting diode 9, and the binding contact layer 11 may be made of, for example, Cu, Ni, Au, or ITO. The protective insulating layer 12 is arranged on both surface of the two bonding contact layers 11 and covers the planarization layer 13. The protective insulating layer 12 may be made of silicon nitride, for example. The black matrix 11 is arranged on and in direct contact with the surface of the protective insulating layer 12 away from the flexible substrate 1.

In some embodiments, the connection electrode 14 may be regarded as a signal input terminal of the display function layer.

In some embodiments, an additional protective layer (not shown) is arranged on the surface of the flexible substrate 1 away from the first connection sub-line 41, to cover the flexible substrate 1 and the second connection sub-line 42, and to expose a part of the second sub-connection 42 to be connected to the signal output terminal of the integrated circuit 8. The additional protective layer may be made of, for example, molybdenum or silicon nitride.

In the method embodiments of the present disclosure, the serial numbers of the steps cannot be used to define the sequence of the steps. As for one skilled in the art, the changes in the order of steps without paying creative work also fall within the scope of the present disclosure.

Unless otherwise defined, technical terms or scientific terms used herein have the normal meaning commonly understood by one skilled in the art in the field of the present disclosure. The words "first", "second", and the like used herein does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

The above descriptions are optional embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A display substrate, comprising:
   a base substrate;
   a display function layer located on a first surface of the base substrate, a first groove arranged in the first surface and recessed from the first surface toward the base substrate, and a first connection sub-line located in the first groove and covering a bottom and each side wall of the first groove, wherein the first connection sub-line is connected to a signal input terminal of the display function layer; and
   an integrated circuit located on a second surface of the base substrate opposite to the first surface, a second groove arranged in the second surface and recessed from the second surface toward the base substrate to the first connection sub-line, and a second connection sub-line located in the second groove, wherein the second connection sub-line is connected to the first connection sub-line and a signal output terminal of the integrated circuit,
   wherein an orthogonal projection of the first groove on the base substrate at least partially overlaps an orthogonal projection of the second groove on the base substrate, and the first groove and the second groove communicate with each other and together penetrate the base substrate.

2. The display substrate of claim 1, wherein a cross-sectional area of the first groove parallel to the base substrate gradually decreases in a direction from the first surface to the second surface.

3. The display substrate of claim 1, wherein a cross-sectional area of the second groove parallel to the base substrate gradually decreases in a direction from the second surface to the first surface.

4. The display substrate of claim 1, wherein a depth of the first groove in a direction from the first surface to the second surface is from one third to two thirds of a thickness of the base substrate in a direction from the first surface to the second surface.

5. The display substrate of claim 1, wherein a depth of the first groove in a direction from the first surface to the second surface is half of a thickness of the base substrate in a direction from the first surface to the second surface.

6. The display substrate of claim 1, wherein the display function layer has a protrusion part protruding outward from the first surface to the base substrate, and the first connection sub-line covers the protrusion part.

7. The display substrate of claim 6, wherein the first connection sub-line and the second connection sub-line are sequentially stacked on the protrusion part in a direction from the first surface to the second surface.

8. A display device, comprising the display substrate according to claim 1.

9. A method for preparing a display substrate, comprising:
providing a base substrate;
etching the base substrate to form a first groove in the first surface of the base substrate which recesses from a first surface to the base substrate;
forming a first connection sub-line in the first groove which covers a bottom and each side wall of the first groove;
forming a display function layer on the first surface, a signal input terminal of which is connected to the first connection sub-line;
etching the base substrate from a second surface of the base substrate opposite to the first surface to form a second groove for exposing the first connection sub-line; and
forming a second connection sub-line connected to the first connection sub-line in the second groove,
wherein an orthogonal projection of the first groove on the base substrate at least partially overlaps an orthogonal projection of the second groove on the base substrate, and the first groove and the second groove communicate with each other and together penetrate the base substrate.

10. The method of claim 9, wherein a cross-sectional area of the first groove parallel to the base substrate gradually decreases in a direction from the first surface to the second surface.

11. The method of claim 9, wherein a cross-sectional area of the second groove parallel to the base substrate gradually decreases in a direction from the second surface to the first surface.

12. The method of claim 9, wherein an integrated circuit is bound on the second surface, and a signal output terminal of the integrated circuit is connected to the second connection sub-line.

13. The method of claim 9, wherein the method further comprises forming a protective layer covering the display function layer after the forming the display function layer on the first surface.

14. The method of claim 9, wherein the base substrate is a flexible substrate, and the providing the base substrate comprises:
forming the flexible substrate on a rigid carrier board, wherein the second surface of the flexible substrate is in contact with the rigid carrier board.

15. The method of claim 14, wherein the etching the base substrate to form the first groove in the first surface of the base substrate which recesses from the first surface to the base substrate comprises:
etching the flexible substrate to form a first groove in the first surface of the flexible substrate.

16. The method of claim 14, wherein the etching the base substrate from the second surface of the base substrate comprises:
peeling off the flexible substrate on which the display function layer is formed from the rigid carrier board, and etching the flexible substrate from the second surface of the flexible substrate.

17. The method of claim 12, wherein the method further comprises:
transferring a micro light-emitting diode on the first surface after the integrated circuit has been bound on the second surface.

18. The method of claim 11, wherein a depth of the first groove in a direction from the first surface to the second surface is from one third to two thirds of a thickness of the base substrate in a direction from the first surface to the second surface.

19. The method of claim 18, wherein a depth of the first groove in a direction from the first surface to the second surface is half of a thickness of the base substrate in a direction from the first surface to the second surface.

20. The display device of claim 8, wherein a depth of the first groove in a direction from the first surface to the second surface is from one third to two thirds of a thickness of the base substrate in a direction from the first surface to the second surface.

* * * * *